Feb. 13, 1951 J. W. CROWNOVER ET AL 2,541,811

HEARING AID AMPLIFIER

Filed Oct. 10, 1947

INVENTORS
H. A. PEARSON
J. W. CROWNOVER

BY [signature]

ATTORNEY

Patented Feb. 13, 1951

2,541,811

UNITED STATES PATENT OFFICE 2,541,811

HEARING AID AMPLIFIER

Joseph W. Crownover, Hartsdale, and Harry A. Pearson, Mount Vernon, N. Y.

Application October 10, 1947, Serial No. 779,083

6 Claims. (Cl. 179—171)

This invention relates to hearing aids and more particularly to electronic amplifier hearing aids of the type which are small enough to be inconspicuously worn on the body of the user.

Among the objects of the invention is improved electronic hearing aids of high efficiency combining a power amplifier output stage arranged for operation with suitable bias to effect efficient and faithful amplification over the relatively wide frequency range required by the hard of hearing with a regeneration arrangement for avoiding the losses caused by the bias supply connections.

Other objects of the invention include a vacuum tube type hearing aid operated by miniature batteries including two high gain amplifier stages, a bias power output stage, regeneration to counteract the losses produced by the lowering of the effective tube operating voltage caused by the bias supply, and showing very little change in performance as the batteries age and the operating voltages drop.

Further objects of the invention include improved techniques for manufacturing vacuum tube type hearing aids of substantially identical characteristics in spite of the normal range of variation of the components.

Figure 1:
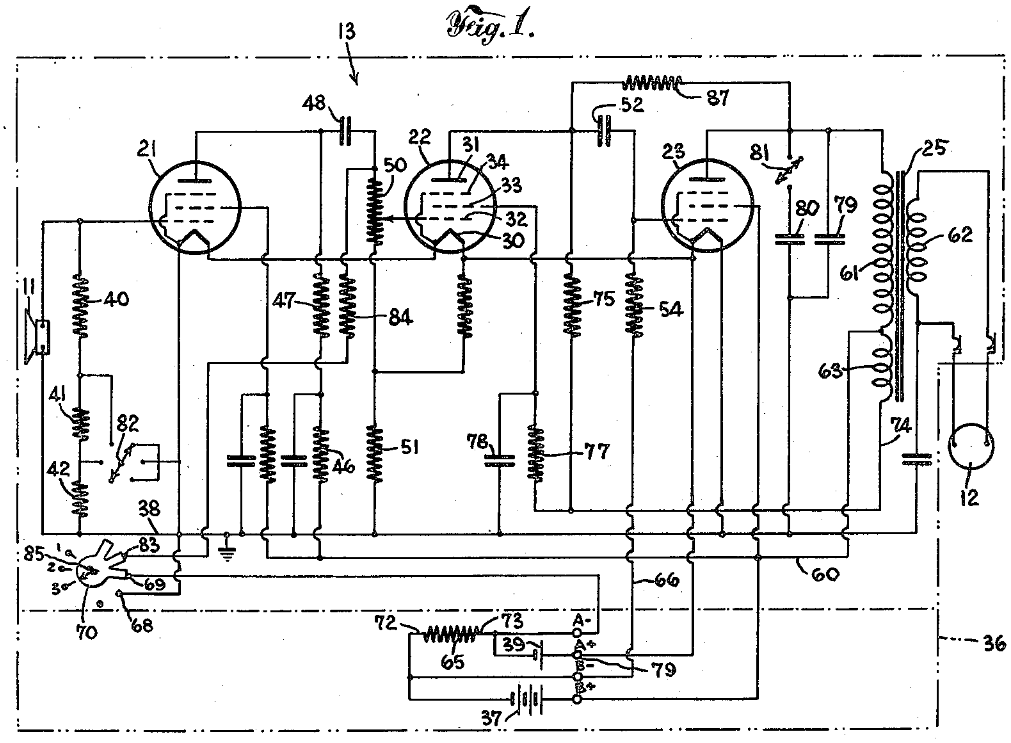
Figure 2:
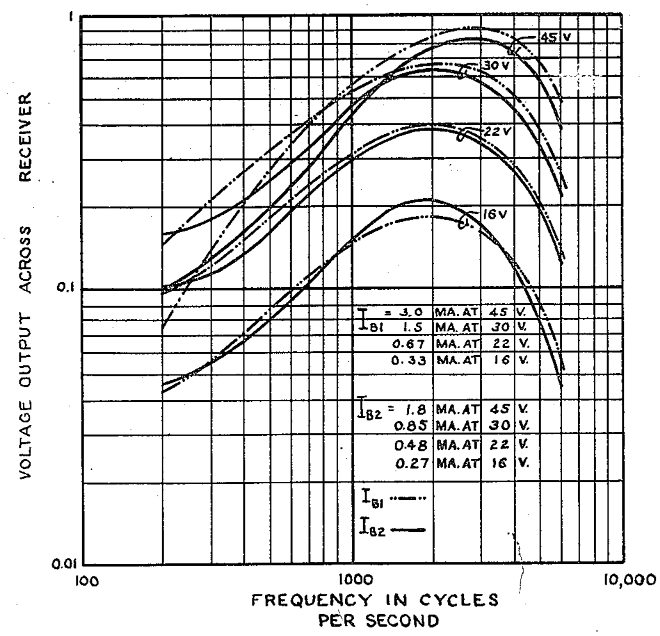

The foregoing and other objects of the invention will be best understood from the following description of various exemplifications of the features of the invention, reference being had to the accompanying drawings, wherein:

Fig. 1 is a circuit diagram of one practical form of hearing aid amplifier arrangement exemplifying the invention; and Fig. 2 is a curve diagram illustrating the operation of the hearing aid arrangement of Fig. 1 under varying battery voltages.

It is well known that vacuum tube type hearing aids operated by miniature electric power supply require a power amplifier tube properly biased for substantially linear class "A" operation to amplify the audible range of sound signals with a minimum of harmonic distortion. Furthermore, the properly biased power amplifier tube uses less plate current during operation, enabling more efficient use of the battery power and greatly increasing the useful life of the miniature battery. Such power amplifier bias has usually been obtained in prior constructions by providing a bias resistor in the power amplifier plate circuit for developing the bias voltage as plate current passes through it. The bias resistor has one end generally connected, along with the power amplifier grid, to one terminal of a miniature plate battery, the other amplifier components being connected to the other end of the bias resistor. As a result, variations of the plate current, produced by variations of the control voltage applied to the control grid, develop a varying signal voltage across the bias resistor as well as a D. C. bias voltage. These signal voltages developed across the bias resistor are fed to the power amplifier grid together with the bias voltage and, being opposite in phase to the voltages supplied from the previous amplifying stages, cause degeneration or decrease the amplitude of the control grid signal and thus decrease the available gain.

The varying signal voltage appearing across the bias resistor may be eliminated by bridging its terminals with a relatively large capacitance to effectively short circuit any alternating current components leaving substantially a pure D. C. bias voltage. The capacitance required for these purposes is of the order of a few microfarads, however, and necessitates quite a bulky condenser. For use in a hearing aid that is intended to be worn on the body, it is important to utilize a minimum of condensers and to provide a compact assembly by using a minimum of parts carefully arranged to occupy as little space as possible. Any condensers incorporated in the hearing aid must be carefully treated to resist the effects of humidity and the normal fairly rapid deterioration with time. A condenser of a few microfarads even if of the electrolytic type occupies enough space and adds so significantly to the deteriorating factors as to make its use totally inadvisable, and heretofore practical compact hearing aids incorporating a bias power amplifier vacuum tube have avoided the used of bias by-pass condensers and exhibit the losses incident to the resulting degeneration.

According to the invention hearing aids of the miniature type worn on the body of the user and including a grid bias resistor in the plate circuit of the power amplifier tube avoid the degenerative losses produced by the biasing resistor without the necessity of providing bulky and rapidly deteriorating by-pass condensers.

Fig. 1 is a circuit diagram of one practical form of hearing aid amplifier according to the invention. It comprises a microphone 11, a signal reproducer 12 and an amplifier circuit, generally designated at 13, for amplifying the signals produced by the microphone and supplying the amplified signals to the signal reproducer 12, which may be a conventional sound generating earphone or vibrating bone-conduction receiver. The amplifier circuit 13, shown, has three amplification stages: a first high gain voltage amplification stage operating with vacuum tube 21; a second high gain voltage amplification stage operating with vacuum tube 22; and a power output amplifier operating with vacuum tube 23 and supplying the signal currents fed to the reproducer 12 through an output transformer 25. The vacuum tubes 21, 22, 23 shown are of the pentode type including an electron-emissive cathode 30, which is of the filamentary type directly heated by passing current through it for causing the emission of electrons. A plate 31 to which is applied a positive voltage with respect to the cathode 30, collects electrons emitted by it. A control grid 32 adjacent the cathode 30 is connected to a source of signals to be amplified and varies the passage of electrons from the cathode 30 to the plate 31. Between the control grid and the plate a screen grid 33 and suppressor grid 34 are mounted, the screen grid 33 being arranged for carrying a relatively high positive potential for improving the passage of electrons to the plate 31, and the suppressor grid 34 being maintained generally at cathode potential for retarding the movement of electrons from the plate 31 toward the other electrodes.

In the arrangement shown, the tubes are operated by a miniature set of batteries contained in a battery compartment 36 and including a relatively high voltage plate supply or B battery 37 and a relatively low voltage cathode heater battery 39.

The microphone 11, which generates a voltage corresponding to ambient sounds, has a pair of output leads which are connected between the grid of the first amplification stage 21 and a signal return or common ground line 38. Across the microphone output leads is also shown connected a set of three resistors 40, 41, 42 in series. Plate current is supplied to the first amplification stage 21 through two plate resistors 46, 47 and the amplified signal voltage at the plate is connected to the input of the second stage 22 through a coupling condenser 48, an input potentiometer 50 and additional input resistance 51.

Amplified output of the second stage 22 is passed through coupling condenser 52 to an input resistor 54 of the third stage. Plate current to the power amplifying stage 23 is supplied from the plate battery 37 through the B+ bus 60 and primary winding 61 of output transformer 25. The amplified signal currents in the transformer primary are fed through the secondary windings 62 to the signal reproducer 12 in the conventional manner.

Biasing of the power amplifier 23 is shown as provided by impressing upon the grid resistor a voltage that is negative with respect to the cathode of this stage. The plate current return from the stages 21, 22, 23 through their cathodes and the common signal return lead 38 is established through contacts 68 and 69 of selector switch 70 and a biasing resistor 65 back to the negative terminal of the plate current supply battery. The grid resistor 54 of the power amplification stage, however, is directly connected to the negative terminal of the plate current supply battery 37 through conductor 66. The passage of plate current through the amplifying stages and resistor 65 causes a voltage drop to appear across the resistor making the end of the resistor 72 at the negative terminal of the plate supply battery 37 more negative than the other end of the resistor 73. In operation with a selector switch 70, set in position 1 or 2 as indicated by the arrow and the applied numerals, the signal return line 38 together with the tube cathodes connected to it are accordingly maintained at a positive potential with respect to the grid of the power amplifying stage and the tube is effectively biased. As a result of its bias the grid of the power amplifier tube 23 operates at a negative potential with respect to its cathode and any voltage excursions of the grid caused by the signals impressed thereon travel along a more linear portion of the response characteristics of this tube and a minimum of harmonic distortion is introduced.

The variations of the plate current passing through the biasing resistor 65 develop across the terminals 72, 73 a corresponding signal voltage of tube 23 becomes more positive, for example, because of the signal voltages impressed thereon by the bias resistor 65, more electrons emitted from its cathode are attracted and directed toward its plate, increasing the plate current and making the instantaneous voltage of its plate more negative with respect to its cathode. This same increase in plate current makes the instantaneous voltage of terminal 73 of resistor 65 more positive than terminal 72. As a result, when an incoming signal tends to make the grid of tube 23 more positive with respect to its cathode, its connection to the bias resistor 65 tends to make the same control grid more negative with respect to the cathode. Correspondingly, during other portions of the signal cycle when the incoming signals impressed on the grid tend to make it more negative with respect to its cathode there will be a decrease in plate current causing the voltage across resistor 65 to decrease so that the negative bias applied to the tube is decreased. It is apparent, therefore, that the signal fluctuations across the biasing resistor 65 are opposite in phase to the signals impressed upon the grid of the power amplifier tube 23, diminishing the effective amplitude of the incoming signals as well as the degree of amplification provided.

According to the invention, the out-of-phase relationship or degenerative bias is counteracted by taking a portion of the amplifier output and feeding it back to a lower gain level portion of the amplifier circuit in phase matching relationship with the phase of the less amplified signals so as to reinforce the lower level signals and obtain a regenerative amplification gain substantially equivalent to that obtained without the objectionable degeneration.

In the form shown, the feedback is established by providing the output transformer with an additional winding 63 connected to a circuit portion of the amplifier having a lower level of amplification. The lower gain level point may be the plate circuit of the amplification stage of tube 22 preceeding the power amplifier. One end of the feedback winding 63 on the output transformer is connected to the B+ bus 60, and the winding is so related to the primary winding 61 that the voltage induced at the other terminal of the feedback winding, represented by the feed-back lead 74, is opposite in phase to the signal voltage on the plate of tube 23, with respect to the bus 60. Due to the fact that the signal voltage on the plate of tube 23 is opposite in phase of that of the grid of the same tube, the feedback lead 74 will have a signal voltage in phase with the grid of tube 23. However, instead of connecting the lead 74 to the grid of tube 23 it is connected to the plate 31 of tube 22 through a plate resistor 75. This obviates the necessity of inserting a blocking condenser in the feedback lead for separating the positive D. C. high voltage circuit part from the control grid of tube 23. Furthermore, the feedback lead 74 is also utilized as a plate current supply to the second amplification stage 22. The screen grid 33 of stage 22 may also have its high voltage supplied to the same feedback lead 74 through series resistor 77 and the by-pass condenser 78. The entire feedback arrangement can accordingly be effected with an insignificant increase of components. The windings 61, 63 of the transformer 25 may be formed of a single winding with an intermediate tap to which the B+ bus 60 is connected. In this form of the invention, except for the extra tap on the transformer 25, no additional components are needed.

The cathode heater battery 39 may be connected to the various cathode filaments in any suitable manner, consideration being taken of the requisite heater currents and voltages. In the form shown, the cathode heater battery 39 is connected between the end 73 of the biasing resistor and a terminal 79 in the battery case 36. The power amplifier tube 23, the cathode of which has a higher emission of electrons than the other tubes, is shown as operated by the full cathode or A battery voltage, the voltage amplifier tubes 21, 22 having their cathode filaments connected in series across the A battery leads.

In the form of the invention shown in Fig. 1, the output of power amplifier tube 23 is bridged by a capacitance 79 for imparting the desired response characteristics to the amplifier assembly. It may have an additional capacitance 80 connected thereacross as by means of the control switch 81 having a contact member movable between an open position, and a closed position in which it completes a circuit from the capacitance 80 to the plate of tube 23. The control switch 81 may be of a nature of a "high-low" switch for selectively adjusting the amplifier gain in the higher frequency range of signals.

Another control 82 is shown as arranged to vary the tonal qualities of the amplifier output by changing the amplifier gain over portions of the frequency spectrum by selectably shorting a part of the resistance in the input circuit of amplifier 21 as desired. The variation in input resistance in combination with other elements of the input circuit including the capacitance across the microphone output and tube input modify the frequency discriminating characteristics of the circuit. The gain of the stage in general decreases with diminishing input impedance so that the gain is accordingly varied for different portions of the frequency spectrum to produce the desired tonal emphasis.

A further control element of the amplifier of Fig. 1 is embodied in the multiposition selector switch 70 rotatable or movable to any one of positions 1, 2, 3. When selector switch 70 is in position 3, the signal return or ground conductor 38 is disconnected from the negative terminals of batteries 39, 37 so that the amplifier is inoperative as long as the switch 72 is in position 3. When the switch 70 is moved to position 2 it interconnects contacts 68, 69 and 83 placing the amplifier in operation and simultaneously connecting resistor 84 across the input circuit of tube 22. The resultant lowering of the input resistance of tube 22 causes the low frequency signals fed from the output of vacuum tube 21 to exhibit a greater portion of their amplified signal voltage across the coupling condenser 48 leaving a smaller portion of the low frequency signal voltages across the input resistance. The high frequency signals, however, are not appreciably affected since for these signals the capacitance 48 presents an extremely small impedance. Accordingly, the low frequency signals are greatly attenuated with selector switch 70 in position 2. This feature is particularly desirable when the hearing aid is to be used in noisy surroundings inasmuch as the noises are largely low frequency sounds and their attenuation permits voice signals to be intelligible and easily understood. When selector switch 70 is placed in position 1, the circuit of resistor 84 is opened and normal amplifier operation is effective.

Fig. 1 shows a battery case 36 housing the batteries 37, 39 secured to the housing of transmitter 13, as indicated by the dot-dash outlines. This arrangement makes a very convenient so-called one piece hearing aid unit which may be arranged for operation with extremely small and compact batteries. Alternatively, the hearing aid of Fig. 1 may be operated with separate batteries connected by a battery cord, for example, to the amplifier housing. With such a modification it is advisable to include a current limiting resistor in the battery circuits close to the batteries themselves for protecting the batteries against accidenal short circuits which may be caused by chafing of the battery cord. Thus, for example, current limiting resistance may be placed in the B— line 66 close to the B battery. By using separate batteries connected to the housing of amplifier 13, the battery bulk does not present a serious problem, and larger sized, more economical batteries may be employed so that the hearing aid as a whole can be operated at lower cost. This is an important consideration inasmuch as the extremely compact batteries intended for incorporation with so-called one piece hearing aids are much more expensive per unit of battery energy as compared to the larger sizes of miniature batteries.

Another feature of the invention is the production and manufacture of hearing aids of approximately constant characteristics on a relatively large scale. Because of the variation in the individual characteristics of the components of the hearing aid, the final assembly invariably exhibits response characteristics falling anywhere within a rather wide range. This is probably due to the fact that the extremely miniature size of some of the components, such as the electrodes of the vacuum tubes 21, 22, 23, have such small dimension and separation that small variations, such as cannot be avoided in ordinary production, are relatively large compared with the standard spacing. In any event, it is not unusual to have two consecutive hearing aids on the same assembly line vary the output characteristics by as much as 6 db.

In accordance with the invention, this discrepancy may be overcome so that the completed final hearing aids are all substantially identical in output characteristics. As shown, this is accomplished by taking a plurality of the assembled hearing aids, testing them to determine the individual response characteristics and adjusting the response levels to provide a generally uniform output corresponding approximately to the output level by adding a degeneration connection to the hearing aids having higher outputs for reducing the higher outputs by the desired amount. The degeneration is provided in the construction shown in Fig. 1 by a feedback connection through resistor 87 from the plate of vacuum tube 23 to the plate of vacuum tube 22. Inasmuch as the signal voltages on the successive plates of a chain of amplifiers are opposite in phase, the feedback connection 87 permits some of the finally amplified signals to mix with a lower level of signal, thereby decreasing the lower signal level and diminishing the amplifier gain. The feedback resistor 87 may be selected from one of several different resistance values for providing any variation in feedback as desired.

In accordance with this phase of the invention, the hearing aid may be simply and readily brought to a predetermined standard more readily suited for fitting to the individual hearing aid user. The user also suffers a minimum of inconvenience when changing from one hearing aid to another as, for example when wearing a spare or borrowed set while one is being repaired. Additionally the production of hearing aids according to the invention is considerably expedited by permitting the incorporation of components which would previously have to be rejected on the basis of too extreme a variation from the predetermined standard. Any excess variations tending to impart higher gain to the completed assembly can be readily counteracted by the suitable degenerated feedback. Excessive variations that tend to diminish the response of the hearing aid may also be compensated for by reason of the fact that the hearing aid construction of Fig. 1 inherently possesses a higher gain than prior practical hearing aids having generally similar components. Part or all of this additional gain may be remitted by setting a standard response, only a small amount higher than the response of such prior hearing aids, at a level, for example, which permits the inclusion of a considerable proportion of components contributing to lower overall gain.

Another phase of the instant invention is the selection of the circuit components of the hearing aid shown in Fig. 1, for example, so that the amplifier response characteristics exhibit very little variation as the electron emission of the vacuum tube cathodes vary. During the life of the hearing aid the electron emission of the vacuum tube cathodes decreases with the age of the vacuum tubes as well as with lowering of the cathode heater battery voltage. The active electron emissive ingredients of the cathode gradually lose their emissivity, and as the cathode heater battery 39 approaches exhaustion its voltage decreases and less heating energy is supplied to the individual cathodes further diminishing their emission. Losses in electron emission from the vacuum tube cathode are generally associated with decreases in plate current and diminished amplifying ability.

However, the utilization of circuit elements having suitable characteristics according to the invention enables the construction of a vacuum tube hearing aid amplifier in which the variations in emission are substantially counterbalanced and the operation of the amplifier remains substantially constant over considerable periods of time even though the batteries approach exhaustion. Thus, for example, the grid resistance of the amplifier stages is chosen at a relatively high value approaching the internal resistance of the vacuum tube between its grid and its cathode. Under conditions of high emissivity, many electrons pass from the cathode to the grid providing a relatively low internal input impedance which keeps the total input impedance at a relatively low value in spite of the high external grid resistance. At this low value of the total input impedance the amplification provided by the stage is somewhat below the maximum obtainable from it. As the emissivity of the tube decreases the tube's internal input impedance increases permitting the total input impedance to also increase by an amount sufficient to appreciably offset the loss of amplification due to diminished plate current. In some cases, a decrease of emissivity may even result in increased amplification. In general, however, the circuit constants are so adjusted that the amplification gain is nearly constant for considerable variation in emissivity.

In this respect it is important to so adjust the self-leveling characteristics of the amplifier that they are effective over the normal range of plate battery voltage with which the amplifier is operated. In general, different persons having different hearing losses to be compensated for by a hearing aid require different amplifier gain characteristics. For example, the hearing aid construction illustrated in Fig. 1 may be used with a 45 volt B battery for persons with a relatively large hearing loss who require considerable amplification. On the other hand, for use by persons having relatively small hearing losses, B battery voltages as low as 16 volts are all that are required. According to the invention the circuit elements of the hearing aid construction are of such characteristics that variations in vacuum tube cathode emission are self-balancing with any of the B battery voltages with which the hearing aid is designed to be used.

By way of example and without in any way limiting the scope of the invention, there are given below the circuit constants of a practical construction of a hearing aid amplifier based on the principles of the invention described above.

| | | |
|---|---|---|
| Resistor 40 | megohms | 0.10 |
| Resistor 41 | do | 0.47 |
| Resistor 42 | do | 4.70 |
| Resistor 47 | do | 1.50 |
| Resistor 46 | do | 0.68 |
| Resistor 84 | do | 0.22 |
| Condenser 48 | microfarads | 0.0005 |
| Potentiometer 50 | megohms | 3.00 |
| Resistor 51 | ohms | 47,000 |
| Resistor 75 | megohms | 1.50 |
| Resistor 77 | do | 2.22 |
| Resistor 65 | ohms | 820 |
| Resistor 87 (if used) | megohms | 10 to 30 |
| Tube 21 | | Type 505 |
| Tube 22 | | Type 505 |
| Tube 22 | | Type P4 |

Fig. 2 is a curve diagram illustrating the self-balancing action of the hearing aid having the circuit constants given above. The full line curves, as indicated, represent the voltage output of the amplifier over the range of frequencies with low plate currents such as is caused by low emission characteristics. The dash-double-dot curves show similar response under high emission characteristics. A pair of curves are shown for each of the typical B battery voltages with which the hearing aid is designed to be used. The curves clearly show that at any B battery voltage the output remains substantially constant in spite of appreciable variations in vacuum tube electron emission and that the desired distribution of output over the frequency band is retained.

Hearing aids constructed according to the invention are not limited to having the compensating feedback exactly as illustrated in the construction of Fig. 1, but may be arranged to feed back signal from any portion of the amplifier to any other portion at which the signal is in a lesser state of amplification. Thus the feedback may be between the output and input of any one stage or between the output of one stage and the input of any lower stage. Regenerative feedback requires the proper phasing between the signals at the high level point of the feedback with those at the low level point, and where the feedback is from the output to the input of the same stage care must be taken to reverse the phase of the signals fed back to compensate for the normal phase reversal effected during amplification in that stage. Because of the extremely high gain provided by the stages, the invention provides the best results when the feedback returns a signal across the minimum number of stages so that unavoidable variations in the feedback circuit constants, normally tolerated in the circuit elements, do not seriously affect the operation. A feature of the invention is the provision of balancing of the regenerative feedback in the same stage at which the degenerative effects occur. This arrangement permits almost perfect balancing of the degeneration without carrying along any of the well-known defects of regenerative circuits, such as the variation with signal frequencies.

The principles of the invention may be applied to any type of hearing aid which embodies a biased vacuum tube power amplification with either one or two preliminary voltage amplification stages or even the absence of other stages.

It will be apparent to those skilled in the art that the novel principles of the invention disclosed herein in connection with specific exemplifications thereof will suggest various other modifications and applications of the same. It is accordingly desired that in construing the breadth of the appended claims they shall not be limited to the specific exemplifications of the invention described above.

We claim:

1. In a method of manufacturing vacuum tube hearing aid amplifiers of substantially identical output characteristics: each amplifier comprising a power amplifying stage including a power tube having an anode, a cathode, and a control electrode on which amplified signal output is impressed; a gain amplifying stage immediately preceding said power amplifying stage and including a gain tube having an anode, a cathode and a control electrode; positive circuit portions and negative circuit portions connecting the anode and the cathode of the power tube to the positive and negative terminals of said battery elements for supplying space current to said power tube; said positive circuit portions including a transformer winding of a transformer through which the output of the power tube is supplied to a load; a part of said negative circuit portion constituting bias resistance portions across which a biasing voltage is developed by said space current; a biasing circuit portion connected between said biasing resistance portions and the control electrode of said power tube for operating said power tube at a desired bias, and also feeding to the control electrode of said power tube a degenerating signal voltage; and a regenerative feed-back circuit portion connected between the output circuit of said power tube and one of the electrodes of said gain stage operated at a positive potential for opposing the effect of said degenerating signal voltage and maintaining said electrode at the operative positive potential; said method comprising testing a series of individual amplifiers to determine their individual response characteristics to determine the amplifier having the lowest output level, and adjusting the feed-back component of the other individual amplifiers of the series so that they all operate with substantially the same output level as the individual amplifier operating with the lowest output level.

2. A method of manufacturing hearing aid amplifiers as defined by claim 1 in which the degenerative component is adjusted to bring the individual amplifiers of the series to generally the same output level..

3. A method of manufacturing hearing aid amplifiers as defined by claim 1 in which the resistance element which forms part of the degenerative circuit portion of the amplifier is adjusted to bring the individual amplifiers of the series to generally the same output level.

4. In an amplifier of a device, such as a hearing aid, worn on the body of the user, having a plurality of amplification stages energized by miniature electric battery elements: a power amplifying stage including a power tube having an anode, a cathode, and a control electrode on which amplified signal output is impressed; a gain amplifying stage immediately preceding said power amplifying stage and including a gain tube having an anode, a cathode, and a control electrode; positive circuit portions and negative circuit portions connecting the anode and the cathode of the power tube to the positive and negative terminals of said battery elements for supplying space current to said power tube, said positive circuit portions including a transformer winding of a transformer through which the output of the power tube is supplied to a load; a part of said negative circuit portion constituting bias resistance portions across which a biasing voltage is developed by said space current; a biasing circuit portion connected between said biasing resistance portions and the control electrode of said power tube for operating said power tube at a desired bias, and also feeding to the control electrode of said power tube a degenerating signal voltage; and a regenerative feed-back circuit portion including windings of said transformer connected between the output circuit of said power tube and one of the electrodes of said gain stage operated at a positive potential for opposing the effect of said degenerating signal voltage and maintaining said electrode at the operative positive potential.

5. In an amplifier of a device, such as a hearing aid, worn on the body of the user, having a plurality of amplification stages energized by miniature electric battery elements: a power amplifying stage including a power tube having an anode, a cathode and a control electrode on which amplified signal output is impressed; a gain amplifying stage immediately preceding said power amplifying stage and including a gain tube having an anode, a cathode and a control electrode; positive circuit portions and negative circuit portions connecting the anode and the cathode of the power tube to the positive and negative terminals of said battery elements for supplying space current to said power tube, said positive circuit portions including a transformer winding of a transformer through which the output of the power tube is supplied to a load; a part of said negative circuit portion constituting bias resistance portions across which a biasing voltage is developed by said space current; a biasing circuit portion connected between said biasing resistance portions and the control electrode of said power tube for operating said power tube at a desired bias, and also feeding to the control electrode of said power tube a degenerating signal voltage; and a regenerative feed-back circuit portion including windings of said transformer connected between the output circuit of said power tube and the anode of said gain stage for opposing the effect of said degenerating signal voltage and maintaining said anode at the operative positive potential.

6. In an amplifier of a device, such as a hearing aid, worn on the body of the user, having a plurality of amplification stages energized by miniature electric battery elements: a power amplifying stage including a power tube having an anode, a cathode, and a control electrode on which amplified signal output is impressed; a gain amplifying stage immediately preceding said power amplifying stage and including a gain tube having an anode, a cathode, a control electrode, and a screen electrode between the control electrode and the anode maintained at a positive potential relatively to the cathode; positive circuit portions and negative circuit portions connecting the anode and the cathode of the power tube to the positive and negative terminals of said battery elements for supplying space current to said power tube, said positive circuit portions including a transformer winding of a transformer through which the output of the power tube is supplied to a load; a part of said negative circuit portion constituting bias resistance portions across which a biasing voltage is developed by said space current; a biasing circuit portion connected between said biasing resistance portions and the control electrode of said power tube for operating said power tube at a desired bias, and also feeding to the control electrode of said power tube a degenerating signal voltage; and a regenerative feed-back circuit portion including windings of said transformer connected between the output circuit of said power tube and the anode of said gain stage for opposing the effect of said degenerating signal voltage, said feed-back circuit portion connecting said battery elements to the anode and the screen electrode of said gain tube for maintaining them at their operative positive potential.

JOSEPH W. CROWNOVER.
HARRY A. PEARSON.

REFERENCES CITED

The following references are of record in the file of this patent:

UNITED STATES PATENTS

| Number | Name | Date |
|---|---|---|
| 2,257,840 | Dubilier | Oct. 7, 1941 |
| 2,302,113 | Faltico | Nov. 17, 1942 |
| 2,308,550 | Shapiro | Jan. 19, 1943 |
| 2,342,544 | Jacobs | Feb. 22, 1944 |
| 2,342,822 | Rumpel | Feb. 29, 1944 |
| 2,367,110 | Fayers | Jan. 9, 1945 |